United States Patent
Ahmad et al.

(10) Patent No.: US 10,250,274 B2
(45) Date of Patent: Apr. 2, 2019

(54) SAMPLE AND HOLD DEVICE

(71) Applicant: Melexis Technologies NV, Tessenderlo (BE)

(72) Inventors: Saad Ahmad, Waltham, MA (US); Volodymyr Seliuchenko, Nashua, NH (US); Sharath Patil, Ashland, MA (US); Darrell Livezey, Brookline, NH (US); Marcelo Mizuki, Nashua, NH (US)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 0 days.

(21) Appl. No.: 15/903,112

(22) Filed: Feb. 23, 2018

(65) Prior Publication Data

US 2018/0248559 A1 Aug. 30, 2018

(30) Foreign Application Priority Data

Feb. 24, 2017 (EP) ................................. 17157859

(51) Int. Cl.
| | |
|---|---|
| H03M 1/12 | (2006.01) |
| G01S 7/486 | (2006.01) |
| H04N 5/378 | (2011.01) |
| G11C 7/10 | (2006.01) |

(Continued)

(52) U.S. Cl.
CPC ........... H03M 1/122 (2013.01); G01S 7/4863 (2013.01); G11C 7/1042 (2013.01); G11C 7/14 (2013.01); G11C 27/024 (2013.01); H03M 1/129 (2013.01); H04N 5/378 (2013.01); G01S 7/4861 (2013.01)

(58) Field of Classification Search
CPC ..... H03M 1/122; H03M 1/129; G11C 7/1042; G11C 27/024; G11C 7/14
USPC .................................................. 341/122, 155
See application file for complete search history.

(56) References Cited

U.S. PATENT DOCUMENTS

| | | | | |
|---|---|---|---|---|
| 8,411,183 | B2 * | 4/2013 | Kato | .................. H01L 27/14609 250/200 |
| 8,624,765 | B2 * | 1/2014 | Watanabe | ............ G11C 27/026 341/122 |

(Continued)

FOREIGN PATENT DOCUMENTS

| | | |
|---|---|---|
| EP | 2192764 A1 | 6/2010 |
| WO | 2014125371 A1 | 8/2014 |

OTHER PUBLICATIONS

European Search Report from EP Application No. 17157859.4, dated Jul. 18, 2017.

*Primary Examiner* — Brian K Young
(74) *Attorney, Agent, or Firm* — Workman Nydegger

(57) ABSTRACT

A sample and hold system, for capturing and reading at least one input signal. The system comprises a readout device, a controller, an array of segments comprising a plurality of unit cells and a dummy unit cell, and segment switches between the segments and the readout device. The controller is adapted for controlling the system such that: during an acquisition phase a trace of samples is taken from the input signal and held in the unit cells; during a readout phase the samples in the unit cells or in the dummy unit cells of a segment are read out by readout device; after opening or closing the segment switches the dummy unit cell, is the first cell which is read out by the readout device.

14 Claims, 7 Drawing Sheets

(51) Int. Cl.
*G11C 7/14* (2006.01)
*G11C 27/02* (2006.01)

(56) References Cited

U.S. PATENT DOCUMENTS 9,219,490 B1 * 12/2015 Pereira ................. H03M 1/007
9,374,104 B2 * 6/2016 Miyahara ............ H03M 1/1033

* cited by examiner

SAMPLE AND HOLD DEVICE

FIELD OF THE INVENTION

The invention relates to the field of sample and hold systems. More specifically, it relates to sample and hold systems, which are adapted for capturing and a plurality of traces from one, or more input signals.

BACKGROUND OF THE INVENTION

In optical sensor applications, such as for example LIDAR applications, typically an analog input signal is sampled with an ADC and next the obtained trace of the input signal is processed to find phase and peak information. In applications where multiple optical sensors (e.g. pixels or pin diodes) are used it becomes impractical to have a high speed ADC for every optical sensor, due to die area cost and power reasons.

A more practical and cost effective method is to use a sample and hold array to sample the trace output and then multiplex the output to an ADC to process the traces.

In these optical sensor applications there is a need for further integration of the different components. This is especially the case for applications with multiple input signals or applications wherein a plurality of traces needs to be acquired.

It is an object of embodiments of the present invention to provide a good sample and hold system.

SUMMARY OF THE INVENTION

It is an object of embodiments of the present invention to provide a good sample and hold system.

The above objective is accomplished by a method and device according to the present invention.

In a first aspect embodiments of the present invention relate to a sample and hold system, for capturing and reading a trace of at least one input signal. The sample and hold system comprises a readout device, a controller, an array of segments, each segment comprises a plurality of unit cells and a dummy unit cell, and access switches for controlling the access to the unit cells and the dummy unit cells. At least part or all of the access switches are segment switches which are present between the segments and the readout device. The controller is adapted for controlling the sample and hold system, such that during an acquisition phase a trace of samples is taken from the input signal and held in the unit cells and such that during a readout phase the samples held in the unit cells or in the dummy unit cells are read out by the readout device, and such that after configuring the segment switches to connect a segment to the reading device, the dummy unit cell, is the first cell which is read out by the readout device.

In embodiments of the present invention the dummy unit cells are sampled in a period when there is no input signal. This may for example be at the end of an application sampling window. The application sampling window may for example be a pre-defined application sampling window. In embodiments of the present invention the sample and hold system may for example be triggered in the beginning and at the end of the application sampling window.

In embodiments of the present invention reading out of the dummy unit cell results in a readout value. In embodiments of the present invention the readout value of the dummy unit cells is ignored during further processing.

It is an advantage of embodiments that it is possible to switch from one segment to another without impacting the samples of the unit cells read out by the readout device. This is achieved by reading out the dummy unit cells during or after opening or closing the segment switches. Each of the different segments may be related with a different input signal which may be related with a different input channel, or they might have the same trace spread out over multiple segments. It is thereby advantageous that it is not required to have an ADC per input channel. This can be avoided because it is possible to switch the different segments alternatingly to the readout device using the segment switches. It is an advantage of embodiments of the present invention that the segment switches in each segment transition during the readout phase of the dummy unit cells, or during a non-readout phase of the unit cells, so that the impact of their switching can be neglected by the application. If a dummy unit cell would not be present, a transition from one segment to another segment or sample readouts from different segments may introduce offsets between the measurements. The charge injection caused by switching the segment switches (including the segment read switches) between the segments and the readout device are impacting the next sample to be read out. It is an advantage of embodiments of the present invention that this next cell is the dummy unit cell. The application which is processing the values read out from the dummy unit cells. In embodiments of the present invention a dummy cell is introduced in each segment. When a sample and hold system according to embodiments of the present invention is used in an measurement application (e.g. a LIDAR application) samples obtained by the dummy cell may be ignored by the application. It is an advantage of embodiments of the present invention that thereby the offsets problem is solved, and it is ensured that residual mismatches do not impact the application and stay below the noise floor. In embodiments of the present invention the dummy unit cell absorbs the offset error and shields the data cells from the offset errors. Since the dummy cell is ignored later on in the application, the desired data is not affected. It is an advantage of embodiments of the present invention that the acquisition phase is decoupled from the readout phase. Thereby the input signal can be sampled during the acquisition phase and later the unit cells can be readout during the readout phase. This makes the requirements on the readout device less stringent.

In embodiments of the present invention the controller is adapted for controlling the access switches using control signals derived from a sample clock for sampling the input signal.

In embodiments of the present invention the control signals are a delayed version of the sample clock.

It is an advantage of embodiments of the present invention that it is not required to implement clock non-overlapping. This can be avoided by delaying the control signals with regard to the sample clock. By introducing the delayed clocks it is possible to prevent two cells from being connected to the input of the readout device at the same time. This minimum required delay may be defined by the fabrication process parasitics and the size of the S/H segment array. It may for example be less than 10% or even less than 5% of the sample clock. In embodiments of the present invention the unit cells are arranged in a two dimensional array of rows and columns. The segments are corresponding with rows in such an array. The access to the unit cells may be controlled by the controller by using control signals for controlling the access switches. In embodiments of the present invention the controller is configured, and the access switches are positioned such that rows and columns in the two dimensional array can be addressed. The control signals for controlling the access switches may in that case be referred to as row and column signals. These row and column signals are clocked by delayed versions of the sample clock to ensure no glitching.

In embodiments of the present invention each segment comprises a digital feedback loop configured to indicate, during the acquisition phase, to the unit cell which is accessed first in the segment that the last unit cell of that segment, before switching to another segment, is accessed.

In embodiments of the present invention the unit cell which is accessed first receives this indication the clock cycle after the last unit cell is accessed. It is an advantage of embodiments of the present invention that glitches caused by a segment transition in the acquisition phase can be reduced by implementing a digital feedback loop in the segments. During the acquisition phase the issue of a glitch at every row transition has been solved by introducing a digital 1 bit feedback loop in every segment (e.g. row) so that the first unit cell in every segment knows if previously the last unit cell in the same segment was addressed in the previous clock cycle.

In embodiments of the present invention each unit cell and dummy unit cell is comprising a capacitor and the capacitors are configured for holding the samples taken from the input signal and for each of the segments the first terminals of the capacitors are connected with one side of one of the segment switches which is connected with the other side to the readout device.

It is an advantage of embodiments of the present invention that the samples obtained during the acquisition phase can be held in the capacitors of the unit cells.

In embodiments of the present invention the controller moreover is configured for controlling the sample and hold system such that during a parasitic equalization phase, in between the acquisition phase and the readout phase at least part of the segment switches are closed.

It is an advantage of embodiments of the present invention that voltage differences which may be present between the acquisition phase and the readout phase are equalized by closing at least part of the segment switches during the parasitic equalization phase.

In embodiments of the present invention the readout device comprises an analog to digital convertor configured for digitizing, during the readout phase, the samples in the unit cells into digitized sample values.

In embodiments of the present invention the unit cells and dummy unit cells are organized in rows and columns wherein each segment corresponds with a row comprising unit cells and a dummy unit cell.

It is an advantage of embodiments of the present invention that a compact sample and hold system can be obtained.

In embodiments of the present invention the readout device comprises an operational amplifier and the unit cells and the dummy unit cell are connected with an input terminal of the operational amplifier.

In embodiments of the present invention the sample and hold system comprises for each segment a segment read switch in between the second terminals of the unit cells and of the dummy unit cell and an output of the operational amplifier.

It is an advantage of embodiments of the present invention that the capacitive load seen by the operational amplifier can be reduced by introducing a switch in between each segment and the output of the operational amplifier.

In a second aspect embodiments of the present invention relate to an optical detector, the optical detector comprises a sample and hold system according to embodiments of the present invention and an array of optical sensors, each optical sensor comprises an input for detecting an optical signal and an output for generating an output signal which is representative for the detected optical signal, wherein the outputs of the optical sensors are the input signals of the sample and hold system.

It is an advantage of embodiments of the present invention that the optical detector comprises a plurality of optical sensors which all can be connected to the sample and hold system. The array of optical sensors may be a 1D or even a 2D array. Using a sample and hold system according to embodiments of the present invention, the noise and/or offsets can be reduced e.g. by using the dummy unit switching the segment switches only during the readout phase of the dummy unit cells. Such an optical detector may for example be used as part of a LIDAR (light detection and ranging) system. In that case a pulsed laser is periodically send out and this sequence of pulses is sampled by the sample and hold system resulting in a plurality of traces which are captured and readout by the sample and hold system. It is an advantage of embodiments of the present invention that by reducing the noise in the obtained digitized system it is possible to extend the range of the LIDAR system.

In a third aspect embodiments of the present invention relate to an application system comprising a signal generation device and a sample and hold system according to embodiments of the present invention wherein the signal generation device is adapted for generating at least one output signal and wherein the at least one output signal is the at least one input signal of the sample and hold system.

In a fourth aspect embodiments of the present invention relate to a method for capturing and reading a trace of an input signal. The method comprises an acquisition phase wherein samples are taken from the input signal and held in unit cells of different segments wherein each segment comprises a plurality of unit cells and a dummy unit cell, and a readout phase wherein the samples in the unit cells are read out segment by segment by a readout device, and wherein the dummy unit cell of a segment is read out directly after connecting the readout device to that segment.

In embodiments of the present invention the method furthermore comprises a parasitic equalization phase in between the acquisition phase and the readout phase, wherein during the parasitic equalization phase segment switches, which are configured for connecting the segments with the readout device, are closed.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
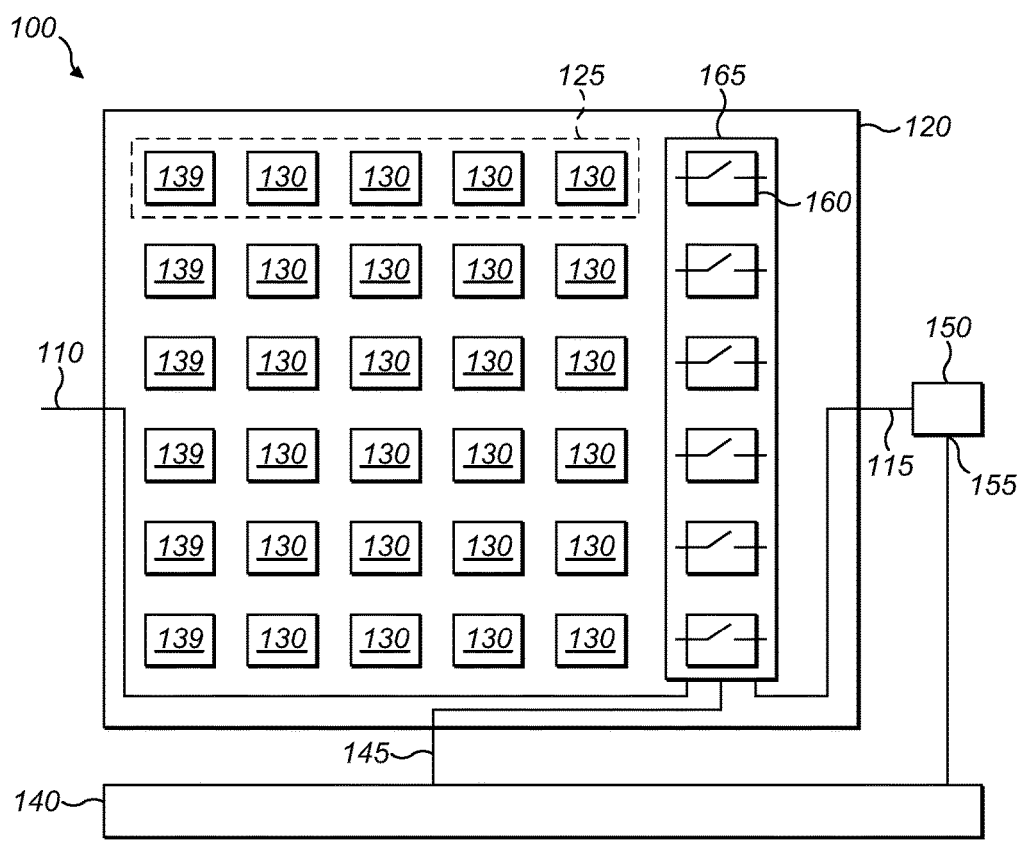
FIG. 1 shows a schematic drawing of a sample and hold system in accordance with embodiments of the present invention.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to a trace of an input signal, reference is made to a certain number of consecutive samples of the input signal. In a first aspect embodiments of the present invention relate to a sample and hold system 100, for capturing a sequence of traces of at least one input signal 110 to an array 120, and reading out the captured traces from the array 120 to the output 115. The sample and hold system 100 comprises a readout device 150, a controller 140, and an array 120, where the array is formed of segments 125 and at least one column 165 of switches 160, comprising a switch 160 for each segment 125 of the array 120. The column of switches is operationally connected to input signal 110 and output 115. By controlling the switches 165 it is possible to control the sampling and read-out operation for each segment. The switches are controlled by the controller 140 through the control input 145 to the array 120. The exact configuration of the switch 160 is a design option for a person skilled in the art. In the following examples three different segment switches are disclosed, namely 160a, 160b, and 160c.

Each segment 125 comprises a plurality of unit cells 130, and a dummy unit cell 139. A segment switch 160b is present between each segment 125 and the readout device 150. Using the segment switches 160b, 160c it is possible to connect or disconnect the unit cells 130 and the dummy unit cell 139 in a segment 125 to or from the readout device 150. Such a readout device 150 may for example comprise an analog to digital convertor (ADC). The segment switches 160c are also referred to as segment read switches.

The controller 140 is adapted for controlling the sample and hold system 100 such that during an acquisition phase a trace of samples is taken from the input signal and each sample is held in a separate unit cell 130 and such that during a readout phase a sample or samples held in one or more of the unit cells 130 or the dummy unit cells 139 are read out by the readout device 150.

The controller 140 is moreover adapted for controlling the rest of the sample and hold system 100 such that after configuring the segment switches 160b, 160c to connect a segment to the reading device 150, the dummy unit cell 139 of the connected segment is the first cell which is read out by the readout device (150).

In embodiments of the present invention the controller is adapted for controlling the sample and hold system 100 such that during a readout phase a segment of unit cells is read out and such that the segment switches are activated at the start of the readout of a segment or at the end of the readout of a segment to avoid segment to segment mismatch.

In embodiments of the present invention the readout device 150 comprises an ADC for converting the samples into digitized sample values. The readout device may also comprise an amplifier before the ADC.

In embodiments of the present invention the unit cells and the dummy unit cells comprise a capacitor for storing the samples.

In embodiments of the present invention the unit cells are arranged in a 2D manner. Segments may for example be organized in rows and a segment switch may be present in each of these rows. An example thereof is illustrated in FIG. 1.

FIG. 1 shows an input signal 110, which is sampled in an array 120 of cells 130, 139. The array comprises segments 125 and each segment 125 comprises a plurality of unit cells 130 and a dummy unit cell 139. The input signal 110 is sampled and held in the different unit cells 130. The controller 140 is operationally connected through control input 145 to the array 120 in order to control the addressing to which of the cells 130 the input signal is sampled and held in. Additionally, the controller 140 is operationally coupled to the control input 155 of the read out device 150, thereby controlling its operation. Using the at least one switch column 165, controlled by controller 140, each of the unit cells 130 and dummy unit cells 139 of a segment can be operationally coupled with the input of the readout device 150 (this readout device may for example comprise an ADC).

Figure 2:
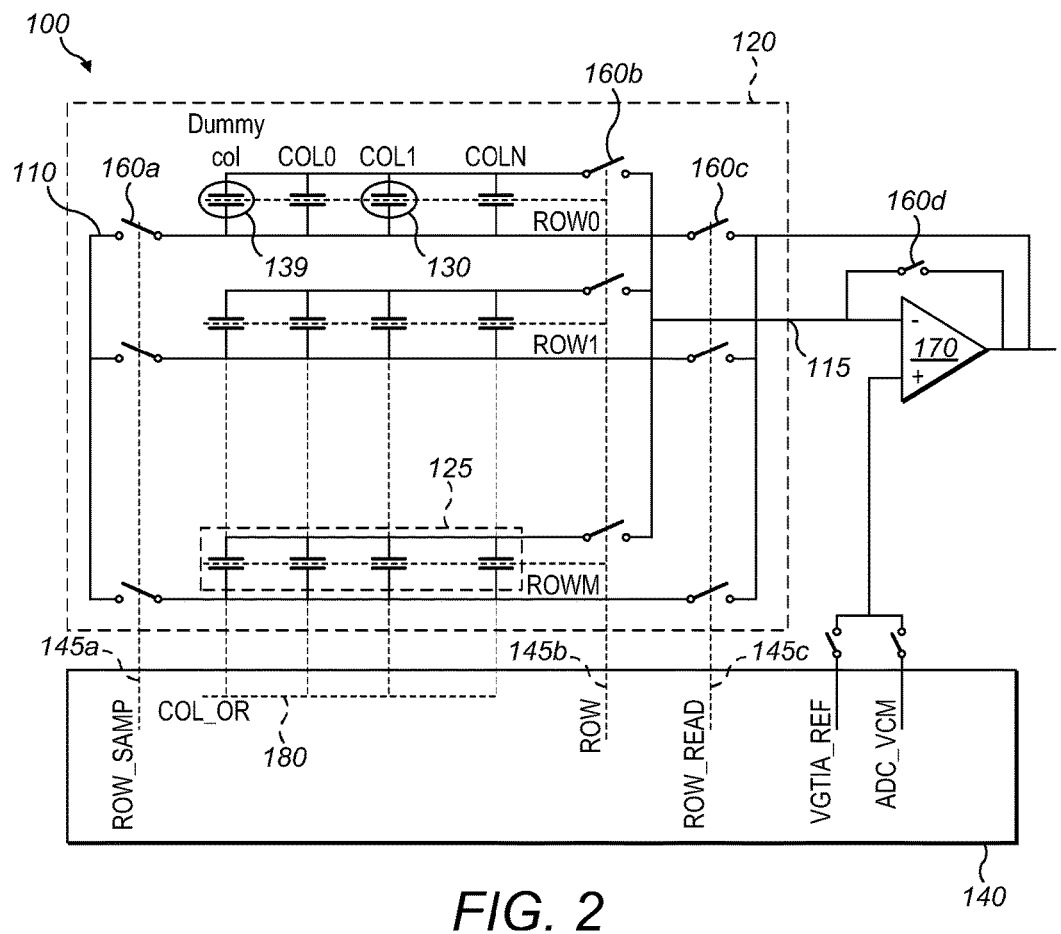
FIG. 2 shows a schematic drawing of an implementation of a 2D array of unit cells and dummy unit cells in accordance with embodiments of the present invention.

In embodiments of the present invention the array 120 of segments 125 is a 2D array of unit cells 130 and dummy unit cells 139. FIG. 2 shows a possible implementation of a 2D array 120 of unit cells 130 in accordance with embodiments of the present invention. The left column in FIG. 2 is a column of dummy unit cells 139. In this example, a dummy unit cell is positioned as the leftmost cell in a segment. However, the invention is not limited thereto and the unit cells may also be on a different position within the segment. The dummy unit cells may have a different position within the segment. The unit cells 130 and dummy unit cells 139 are represented by capacitor symbols. However, the invention is not limited thereto. The unit cells may be any type of cells suitable for holding a sample. The complexity of the unit cells may also be more than just a capacitor as will be explained later (see FIG. 3). In this exemplary embodiment of the present invention the controller 140 is adapted for controlling the sample and hold system such that in the acquisition phase this column is sampled at the end of the normal application sampling window (before sampling into a new segment or after sampling into a previous segment). In this exemplary embodiment of the present invention in the readout phase each dummy cell 139 may be read out as the first sample after every segment transition.

In this example the sample and hold block 120 is used to acquire 80 samples of the input signal. The input signal may for example be coming from an optical sensor transimpedance amplifier output. This input signal may for example be sampled at 100 Ms/s and stored in the capacitors 132 of the unit cells 130 of the sample and hold array (e.g. during a period of 10 μs). The sampled capacitors can for example be readout at 80 Ms/s by an ADC.

In embodiments of the present invention the sample and hold system comprises a sample clock for clocking the controller for sampling the input signal. In embodiments of the present invention another clock may be used for clocking the controller during the readout phase.

The different segments in the array of segments can serve as buffer between the sampling and the readout and hence allow to use different clock frequencies between the acquisition phase and the readout phase.

It is an advantage of embodiments of the present invention that the clock frequency of the sample clock during the acquisition phase can be different from the clock frequency of the clock used in the readout phase. This decoupling between sampling and readout clocks is particularly useful because it allows to use a cheaper, lower frequency ADC.

In embodiments of the present invention an optical sensor array may be connected with the sample and hold system 100. It is thereby advantageous that the samples can be stored in the sample and hold array 120. This allows reducing the number of ADCs. In some cases even one ADC may be sufficient. A reduction of ADCs is advantageous because it is not practical to have multiple high speed ADCs in parallel due to die cost, power requirements, die aspect ratio and technology limitations. If the number of samples which have to be taken is increasing it becomes more difficult to put all the capacitors of the sample and hold array in 1 row (1D array). For example, if a trace comprises 80 samples, it will be required to put 80 capacitor switches connected to the input terminal of the operational amplifier. In addition this very sensitive net would be spread over the whole sample and hold array, and it would need 80 different addressing signals, making the routing overly complicated. This in comparison with a 2D layout wherein every individual unit cell can be addressed by ANDing COL <x> and ROW <y> signals. Thus X+Y number of signals are sufficient wherein X is the number of columns and Y is the number of rows. In the 1D case, wherein all of these unit cells are put in a row, one signal is required per unit cells. Hence X*Y signal paths have to be routed.

Figure 3:
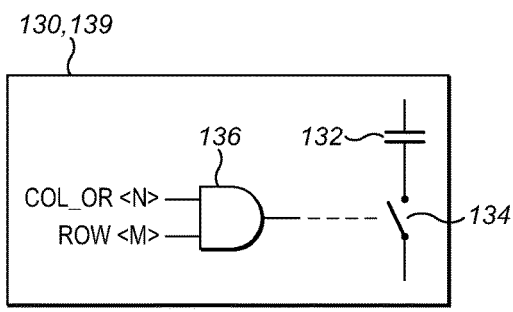
FIG. 3 shows a schematic drawing of an implementation of a unit cell in accordance with embodiments of the present invention.

In this example, the array 120 comprises unit cells 130 organized in a plurality of rows and columns (80 unit cells in this example). The unit cells 130 in FIG. 2 are shown as capacitors. A more detailed drawing of a possible implementation of a unit cell 130 is shown in FIG. 3. The readout device 150 may comprise an operational amplifier 170. This is illustrated in FIG. 2, wherein at the output stage 115 of the array 120, an operational amplifier 170 is connected with the sample and hold array 120. This operational amplifier can be connected with any of the segments 125 containing unit cells 130 in the array 120 to readout a sample from a unit cell 130. The output of the operational amplifier 170 may for example be connected with a single ended to differential amplifier, which then is connected with a differential input high speed ADC, such that it can drive the ADC. It is an advantage of embodiments of the present invention that the number of unit cells can be easily scaled by adding rows or columns without changing the op-amp design specifications. In embodiments of the present invention the array 120 of unit cells (a sample and hold array) captures an input signal which may come from an optical sensor.

The acquisition phase and the readout phase are controlled by the controller 140. The sample and hold array may comprise a plurality of switches 160 for controlling the access to the different unit cells 130 and dummy unit cells 139. The controller 140 may control these different switches 160 for controlling the acquisition phase and the readout phase.

The control of the switches 160 can be explained by using the exemplary embodiment illustrated in FIG. 2. It should be understood that other configurations of the switches are possible and thereby leading to a different control of them. In this exemplary embodiment of the present invention the segments are organized in rows. Row access switches 160*a*, 160*b*, 160*c*, are used to enable the controller to control the access (for sample acquisition or for sample readout) to the different unit cells 130 in each row.

Segment switches 160*b*, 160*c* are connected between the unit cells and the readout device. Each segment switch 160*b* is on one side connected with the first terminals of the unit cells 130 of one segment and on the other side with the negative input terminal of the operational amplifier 170. Segment read switches 160*c* are a specific type of segment switches. In the example of FIG. 2 each segment read switch 160*c* is on one side connected with the second terminals of the unit cells 130 of one segment and on the other side with the output of the operational amplifier 170. The output of the operational amplifier 170 is connected with negative input terminal of the operational amplifier 170 using a switch 160*d*. The positive input terminal of the operational amplifier 170 is either connected with VGTIA_REF or either with ADC_VCM. With which one of the two it is connected can be controlled by the controller 140. This allows the amplifier 170 to switch between continuous acquisition with the reference set by the transimpedance amplifier (VGTIA_REF) and between readout with the cap voltage reference set by the ADC_VCM (different from VGTIA_REF). The transimpedance amplifier is in this case the transimpedance amplifier for the input signal. This switch 160*d* is closed during the acquisition phase and open during the readout phase. Each row sampling switch 160*a* is on one side connected with the input signal and on the other side with the second terminal of the unit cells 130 of one segment.

In embodiments of the present invention the controller is adapted for controlling the sample and hold system 100. In this exemplary embodiment of the present invention this is done using signals to control different switches. In this exemplary embodiment of the present invention the row switches 160*b* are controlled by the controller 140 using ROW signals 145*b*. The row sampling switches 160*a* and the row read switches 160*c* can be controlled by the controller 140 using row sampling signals ROW_SAMP 145*a* and row read signals ROW_READ, 145*c* derived from the ROW signals. The row sampling signals are only required during the acquisition phase and the row read signals are only required during the readout phase.

In the exemplary embodiment illustrated in FIG. 2 a column in the 2D array of unit cells 130 and dummy unit cells 139 may be selected by a COL_OR signal 180. Such a column may for example be a column of unit cells or a column of dummy unit cells.

The capacitor symbol 130, 139 in FIG. 2 represents a unit cell 130, 139. A possible implementation thereof is illustrated in FIG. 3. It comprises a capacitor 132, a unit switch 134 in series with the capacitor 132 looking in towards the negative input terminal of the operational amplifier 170. In embodiments of the present invention a unit cell may comprise two switches, one on either side of the capacitor 132. The unit switch 134 is controlled by the controller 140 and the purpose of the switch is to select the individual unit cell for either sampling or reading out. In this example an AND gate 136 is used to control the switch. The AND gate 136 has two inputs: one is the COL_OR signal 180 and one is the ROW signal. Using both signals it is possible to close the unit switch 134 of a unit cell for a specific row and a specific column.

In embodiments of the present invention a delayed version of the sample clock is generated to maximize the time the operational amplifier 170 has to acquire the signal and then to convert the sample, i.e. the stored charge, to output voltage during the readout phase. In this exemplary embodiment of the present invention the controller 140 is adapted for generating the edges of the ROW signals from a delayed version of the sample clock to ensure that the switches are opened and closed in the specific order and without overlapping or glitches. It is an advantage of embodiments of the present invention that the time the operational amplifier 170 has to readout and resolve the sample voltage of a specific unit cell is maximized during readout. The order of operating the switches is thereby such that corresponding samples for different traces are assigned to different unit cells. In embodiments of the present invention the delayed sample clock is used without having to implement non-overlapping clocks (as is typical for switch cap circuits) for isolating unit cells in the acquisition phase and in the readout phase.

Figure 4:
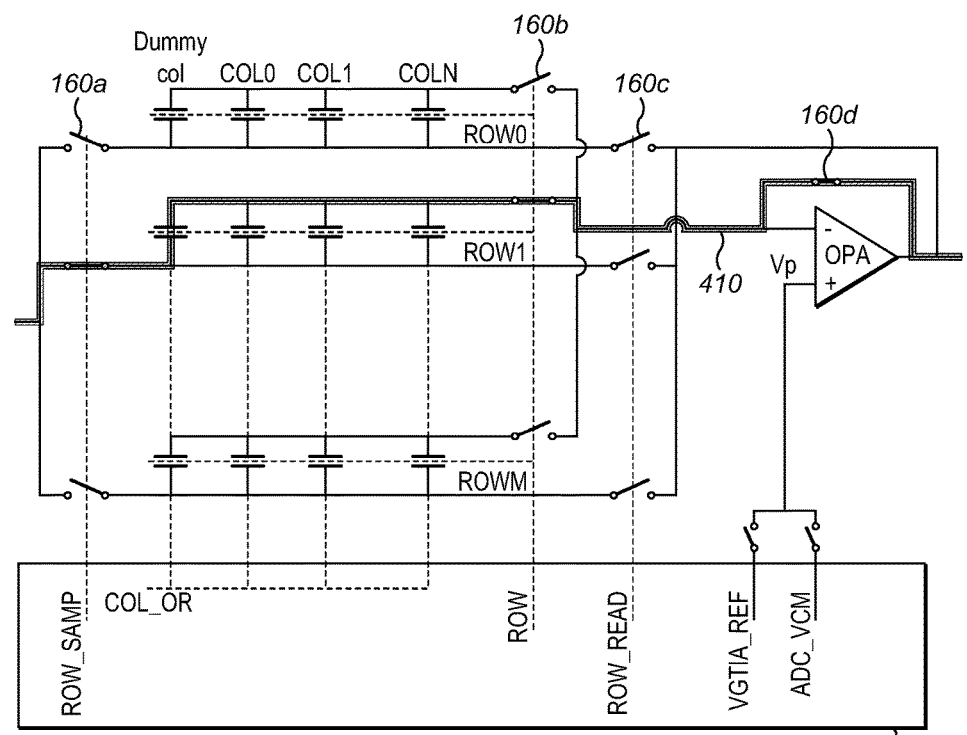
FIG. 4 shows an acquisition phase of the sample and hold system of FIG. 2 in accordance with embodiments of the present invention.

While prior art sample and hold designs sample for half a period and readout during the second half of the period of the sample clock (e.g. sample while the sample clock is high and readout when the sample clock is low), it is an advantage of sample and hold systems according to embodiments of the present invention that the input signal can be sampled during the whole sample clock period, since the readout phase can be executed after the required input signals are sampled (e.g. a few traces of input signals may be taken from the input signal and stored in the unit cells). FIG. 4 shows an acquisition phase of the sample and hold system of FIG. 2. In the acquisition phase the controller 140 may have configured the sample and hold system as illustrated in FIG. 4 by the line 410. This line highlights the sampling path for one sampling acquisition. In this example the row sampling switch 160*a*, controlled by the signal ROW_SAMP, and the segment switch 160*b* corresponding with the ROW1 are closed. The row read switches 160*c* are opened. Also the switch 160*d* is closed and the unit switch 134 corresponding with the selected unit cell is closed. In that case the input signal is connected with the second terminal of the capacitor 132 (the input voltage is connected with the output of a transimpedance amplifier). The first terminal of the capacitor 132 is connected with the output of the operational amplifier, and the positive terminal of the operational amplifier is connected with the reference voltage VGTIA_REF. In short during acquisition one side of the capacitor is driven by the output of the transimpedance amplifier and the other end is driven by the operation amplifier in follower mode (through closed switches).

Figure 5:
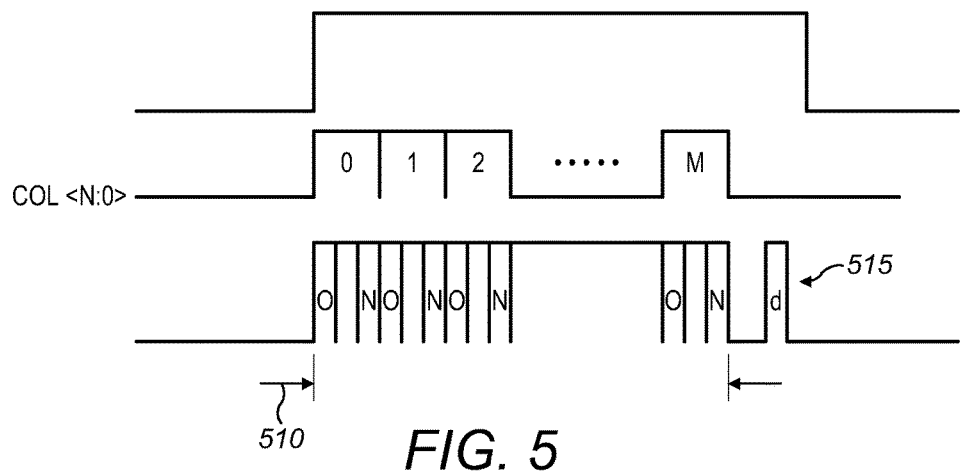
FIG. 5 illustrates a possible timing diagram of signals generated by the controller during the acquisition phase of a sample and hold system as illustrated in FIG. 2 in accordance with embodiments of the present invention.

FIG. 5 illustrates a possible timing diagram of signals generated by the controller during the acquisition phase of a sample and hold system as illustrated in FIG. 2. The top signal indicates the period of the acquisition phase. In embodiments of the present invention this signal is the enable signal for enabling the acquisition phase. The signal below shows in which segment the input signal is sampled. The bottom signal shows which unit cell or dummy unit cell is selected within a segment. In this example the columns are selected sequentially from the first column to the last column. During the normal application sampling mode 510 for each segment (0 . . . M), the input signal is sampled to unit cells on the different columns (0 . . . N). In this exemplary embodiment of the present invention an additional signal is generated by the controller after sampling a complete segment and/or before sampling a new segment. This additional signal d is used in the acquisition phase to sample a value to all dummy unit cells in parallel. In this example the dummy unit cells are not accessed when one of the individual segments is addressed but a value to all of the dummy unit cells are sampled in parallel when the signal col<d> goes high, after the normal application window ends.

It is thereby an advantage of embodiments of the present invention that the incoming signal (e.g. an optical sensor output) is sampled in the dummy unit cells during a quiet phase. As otherwise, an arbitrary voltage will impact the performance of the offset removal, as the arbitrary settling errors from dummy column readout (explained further in detail) will impact the next sample being readout and cause offsets.

In embodiments of the present invention the input signal may also be sampled in the dummy unit cell in parallel with the last unit cell which will be read out before reading out the dummy unit cell.

Figure 6:
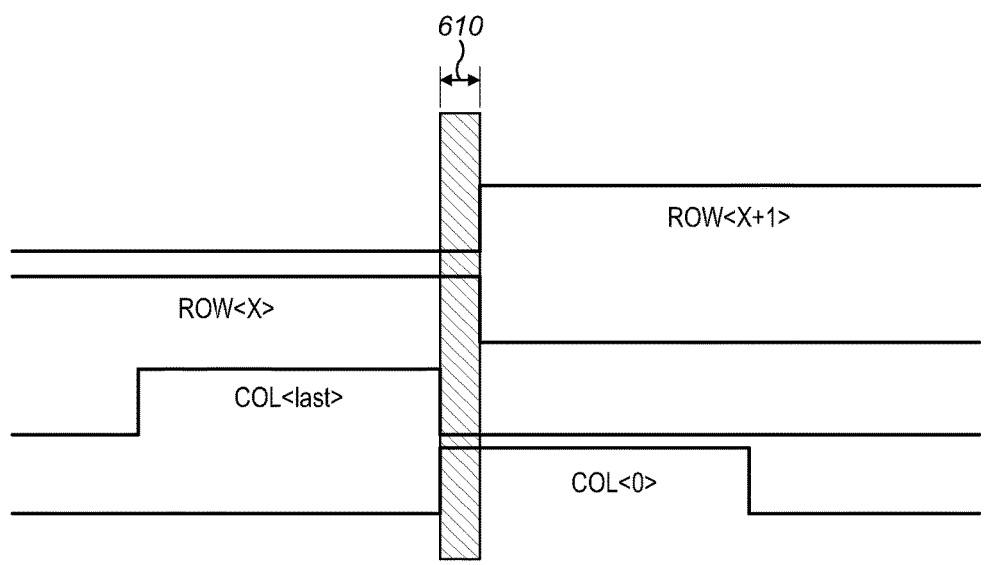
FIG. 6 illustrates the occurrence of a glitch using a timing diagram which can be suppressed using a digital feedback loop in accordance with embodiments of the present invention.

In embodiments of the present invention the signals are generated by a delayed version of the sample clock to ensure all switches operate in the designed order. Due to this there is a potential glitch when a transition is made from one segment to another segment (in the example of FIG. 4 a segment corresponds with a row). An example of such a glitch is illustrated in FIG. 6. When for example going from ROW<0>,COL<last> to ROW<1>,COL<0> this can result in a glitch 610 due to which ROW<0>, COL<0> can be accessed resulting in the deterioration of the already sampled signal in the corresponding unit cell. It is an advantage of embodiments of the present invention that this glitch can be suppressed.

In embodiments of the present invention a digital feedback loop (e.g. a digital binary feedback block) is present in every segment. Using this digital binary feedback block, a unit cell at the beginning of the sampling of a segment (e.g. the unit cell at COL<0>) can keep track of whether the unit cell at the end of the sampling of a segment (e.g. the unit cell at COL<last>) was sampled one clock cycle earlier.

Figure 7:
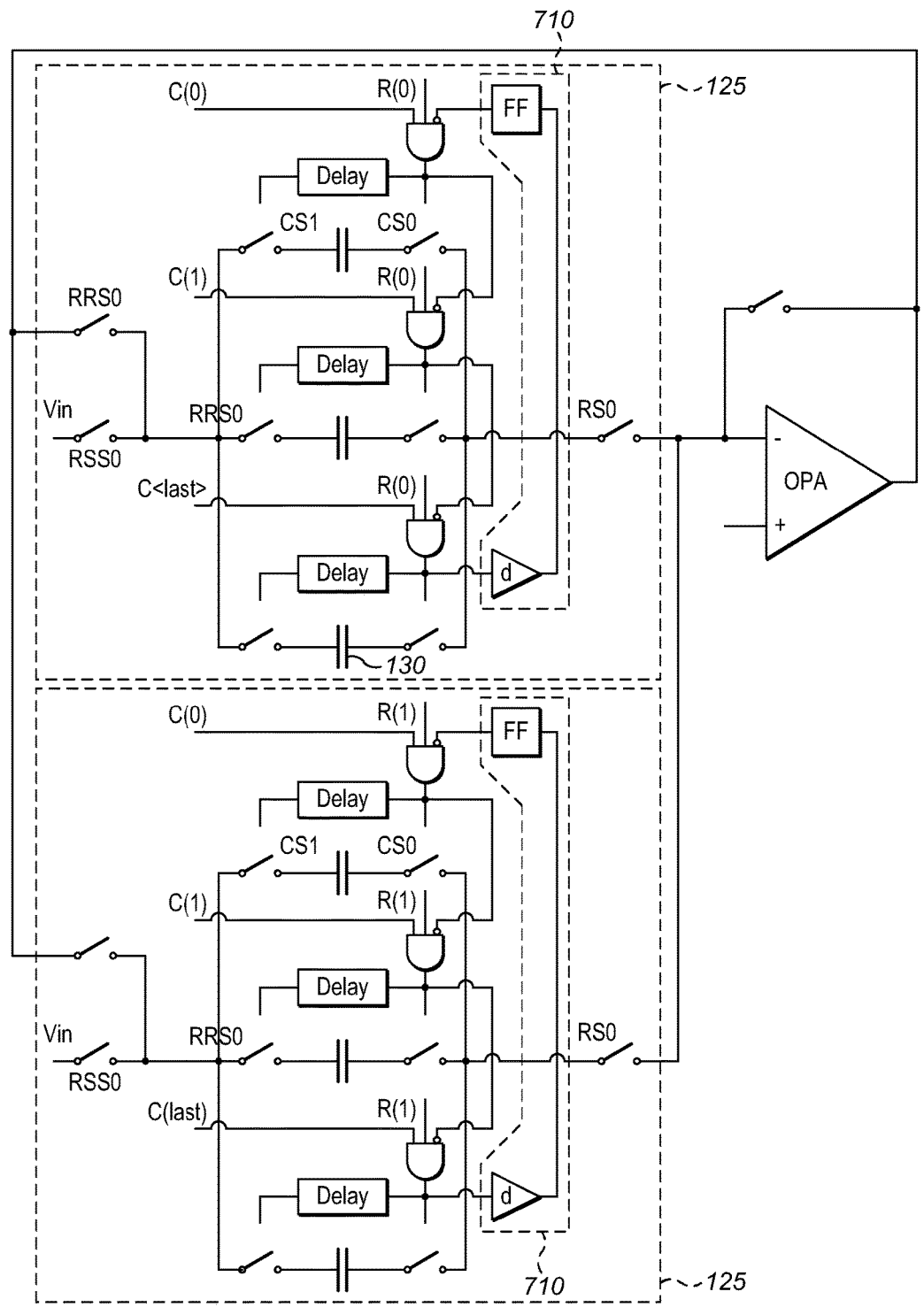
FIG. 7 shows a schematic drawing of a digital feedback loop in accordance with embodiments of the present invention.

An exemplary implementation of such a digital binary feedback block, in accordance with embodiments of the present invention, is illustrated in FIG. 7 wherein two segments 125 are shown. Each segment comprises unit cells 130. The access to the unit cells 130 can be controlled by the switches CS1, CS0, RSS0, RRS0, RS0. FIG. 7 also shows a digital feedback loop 710 per segment 120 for suppressing the glitch during row transition in the acquisition phase.

In this example, CS0 and CS1 are switches inside a S/H unit cell 130. CS0 is connected between one side of the capacitor of the unit cell and the negative input terminal of the opamp 170. CS1 is connected between the other side of the capacitor of the unit cell and of the output of the opamp 170 (if switch RRS0 is closed) or the input signal (if switch RSS0 is closed). Each unit cell also comprises an AND gate for controlling these switches. The AND gate has the COL_OR (Q) signal 180 and the ROW (R) signal as input.

In this example switch RS0 corresponds to segment switch 160b. Switch RRS0 corresponds with segment read switch 160c, and RSS0 corresponds with row access switch 160a.

When, during the acquisition phase, the last capacitor of the first segment 125 (the top segment in FIG. 7) is sampled, next the first capacitor of the second segment will be sampled. But, as explained in FIG. 6, there may be a glitch in the first capacitor of the first segment. During this glitch the switch CS0 of the first segment is closed and this causes a deterioration of the sampled signal.

To prevent this, the digital feedback look 710 checks if the last unit cell in the same segment was accessed in the previous cycle. If it was then the AND output for the first unit cell of this segment will be 0.

In this exemplary embodiment of the present invention this is done by adding a third input to the AND gates. For the unit cell which is accessed the first in a segment during the acquisition phase, this third input is coming from the digital feedback loop 710, which at its input side is connected with the output of the AND gate of the unit cell which is accessed the last during the acquisition phase of a segment. If the last unit cell of a segment is accessed the previous cycle, then the output of the digital feedback loop is 1, this output is inverted at the input of the AND gate of the first unit cell and hence the switches CS0 and CS1 of the first unit cell will not be closed if the last unit cell was accessed during the previous cycle. The digital feedback loop 710 comprises a delay element d followed by a flipflop FF wherein the flipflop is clocked by the inverted version of the sample clock.

In the example illustrated in FIG. 7, the AND gates of the other unit cells (all but the first unit cell) have an inverting input which is connected with the output of the AND gate of the previous unit cell. Thereby it is prevented that two unit cells are accessed simultaneously when switching from one unit cell to the other.

Figure 8:
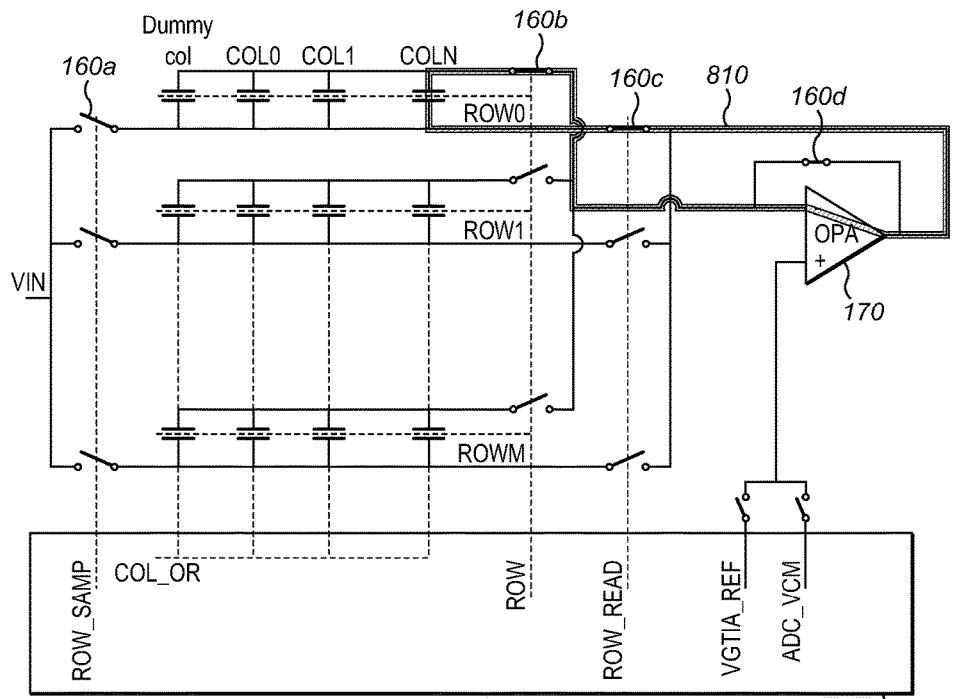
FIG. 8 shows a readout phase of the sample and hold system of FIG. 2 in accordance with embodiments of the present invention.

In the readout phase the sequencer 140 may have configured the sample and hold system as illustrated in FIG. 8 by the line 810. This line highlights the readout path for accessing a capacitor 132 during the readout phase. In this example, the switch 160d is open during the readout phase. The row read switch 160c and the row switch 160b for the row to be read are closed. The voltage at the positive terminal of the operational amplifier 170 is connected with ADC_VCM and the capacitor is connected through closed switches with the first terminal to the output of the operational amplifier and with the second terminal to the negative input terminal of the operational amplifier.

In this exemplary embodiment of the present invention, during acquisition and readout the different switches 160 are controlled by the sequencer 140.

In embodiments of the present invention the samples are written in the sample and hold array of unit cells in a sequential matter. This is controlled by the controller 140. For example if, in a 2D sample and hold array 120 of unit cells 130, a sample is written to CAP<ROW0,COL0>, then the next sample is written to CAP<ROW0,COL1>.

Figure 9:
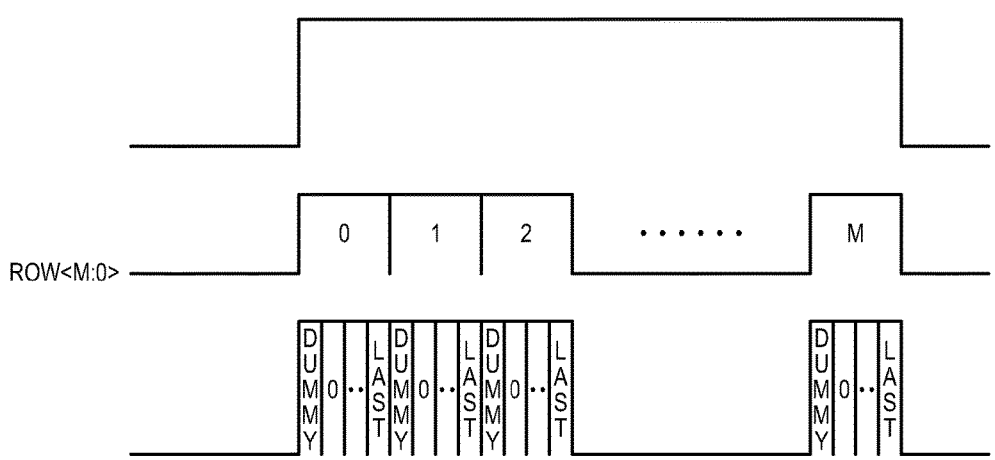
FIG. 9 illustrates a possible timing diagram of signals generated by the controller during the readout phase of a sample and hold system as illustrated in FIG. 2 in accordance with embodiments of the present invention.

FIG. 9 illustrates a possible timing diagram of signals generated by the controller 120 during the readout phase of a sample and hold system 100 as illustrated in FIG. 2. The top signal indicates the period of the reading phase. In embodiments of the present invention this signal is used to enable the readout phase. In that case the switches not needed for the readout will be set open. The signal below shows in which segment the unit cells 130 or dummy unit cells 139 are read out. The bottom signal shows which unit cell or dummy unit cell is read out within a segment. In this example, the columns are selected sequentially from the first column to the last column. During the normal application readout mode for each segment (0 . . . M), first the dummy unit cell 139 and next the unit cells 130 on the different columns (0 . . . N) are read out.

The main difference as compared to the acquisition phase timing is the dummy unit cell access after every row transition. This is needed only during the readout phase as the charge injection from the extra row switch (row switch 160b) transition impacts the high impedance input terminal of the opamp 170 (not so in the acquisition phase). This charge injection translates into the offset in the unit cell 130 being read out. Hence by inserting a dummy unit cell readout in this location the effect of the offset is ignored in application. The digitized sample values of the dummy unit cell are ignored. In embodiments of the present invention the readout device comprises an ADC. In embodiments of the present invention the ADC sampling the output of the unit cells and the dummy unit cells (which may be organized in a column) ignores the output for the dummy unit cell.

Where in embodiments of the present invention reference is made to the application sampling window, reference is made to the measurement period during which the incoming signal is sampled. The incoming signal may for example be 1 or two (or more) pulses somewhere in a 800 ns window. The invention is, however, not limited thereto. In embodiments of the present invention the arbitrary analog signal is captured (during the acquisition phase) and preserved in the array of unit cells for later readout.

In embodiments of the present invention the controller is configured for controlling the sample and hold system 100 such that in the acquisition phase the dummy unit cells are sampled at the end of the application sampling windows (e.g. during the last 100 ns of the 800 ns window cited above). It is thereby an advantage of embodiments of the present invention that the dummy unit cells are sampled in the quiet period. Thus, it can be ensured that the dummy unit cells are sampled when there is no input signal 110. It is thereby an advantage of embodiments of the present invention that the $2^{nd}$ order offset cause is minimized. This $2^{nd}$ order offset cause comes from the fact that if the sample voltage of the dummy unit cell was very different from the trace floor then the settling time errors will also show up as offsets. This settling time error may for example come from the settling time error of the operational amplifier 170. It is an advantage of embodiments of the present invention that the detection of false pulses during a quiet period is avoided. It is an advantage of embodiments of the present invention that most of the false pulses are removed by readout of the dummy cells. A much lower residual offset may be remaining which can even be further minimized by sampling at the end of the application window thereby ensuring that the dummy voltage is not significantly different from the trace floor.

There can be a case when there is a pulse around the row transition but a dummy unit cell has a voltage sampled during the quiet period. In this case there is going to be a slight distortion of the pulse shape (e.g. caused by the opamp sampling error), but this will be within the peak detection algorithm, as the worst case for the algorithm is to have false pulses detected due to the offsets in a very quiet period. To reduce, or even completely eliminate the 2nd order offset, the signal level on the dummy unit cell should closely match the signal level on the first unit cell of the same segment. If there is an effective signal pulse sampled on the first unit cell then there will be an offset between the dummy unit cell and the first unit cell. This will lead to a distorted level on the signal readout. But this is typically acceptable since only very large signals will cause significant distortion, and very large signals are easy to detect and very tolerant of distortion.

In the sample and hold system 100, illustrated in FIG. 2, the positive terminal of the operational amplifier 170 is connected to TIA reference voltage (VGTIA_REF) during the acquisition phase, and during the readout phase it is connected to the ADC_VCM reference voltage.

In applications there can be a big difference between these voltages. This delta can be an issue as the primary terminals of the unit cells and of the dummy unit cells would have at the beginning of the readout phase voltages set by the TIA output reference signal and during the readout of first capacitor on every segment the primary terminals will have to be charged to the ADC_VCM voltage. As to charge the primary terminals the current will have to go through the capacitor 132 of the unit cells 130, this delta between the reference voltages translates into sample offset.

It is an advantage of embodiments of the present invention that this offset can be reduced by reading out the dummy unit cells after every row transition.

If the TIA reference voltage and the ADC_VCM will have a large enough delta the technology limits will make the residual offset big enough to possibly impact the samples obtained by the readout device.

It is an advantage of embodiments of the present invention that by inserting a parasitic equalization phase (PAREQ mode) in between acquisition and readout phases it is possible to eliminate this problem even further. During this parasitic equalization phase the segment switches 160b and possibly also the segment read switches 160c are closed.

By closing the segment switches 160b and possibly also the segment read switches 160c, of the sample and hold system illustrated in FIG. 2 (all other switches are open), during a few clock cycles, the first terminals of the unit cells and dummy unit cells are charged to the ADC VCM voltage before the readout phase starts. Thereby the design requirements on the S/H op-amp design are reduced and the offsets mentioned earlier are removed.

Figure 10:
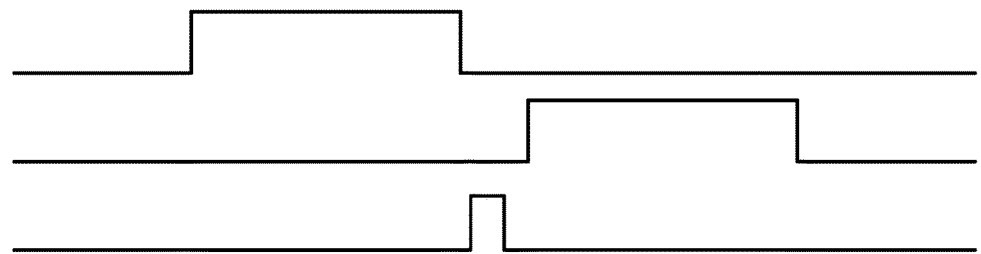
FIG. 10 illustrates a possible timing diagram with regard to the acquisition phase, the readout phase and the parasitic equalization phase in accordance with embodiments of the present invention.

FIG. 10 illustrates a possible timing diagram with regard to the acquisition phase, the readout phase and the parasitic equalization phase. The top timing diagram shows when the acquisition phase is active, the middle diagram shows when the readout phase is active, and the bottom diagram shows when the parasitic equalization phase is active. In this diagram is illustrated that the parasitic equalization phase is active between the acquisition phase and the readout phase.

Figure 11:
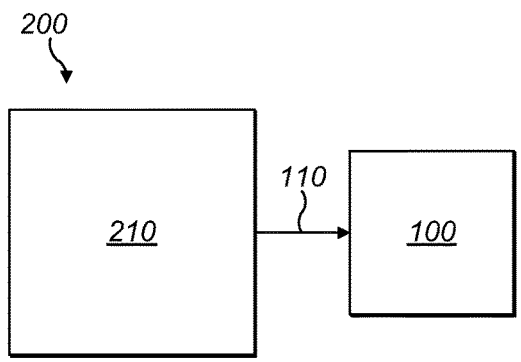
FIG. 11 shows a schematic drawing of an optical detector in accordance with embodiments of the present invention.

In a second aspect, embodiments of the present invention relate to an optical detector 200. The optical detector comprises a sample and hold system 100 in accordance with embodiments of the present invention. The optical detector moreover comprises an array 210 of optical sensors. Each of these optical sensors comprise an input for detecting an optical signal and an output for generating an output signal, which is representative for the detected optical signal. The optical detector 200 is configured such that the outputs of the optical sensors are the input signals of the sample and hold system 100. An example of such an optical detector 200 in accordance with embodiments of the present invention is schematically drawn in FIG. 11.

Sample and hold systems according to the present invention may work with wide ranges of analog inputs in terms of voltage range, and bandwidth. Therefore, it may be applied in many applications where noise reduction is important. It may be used in applications where multiple high-speed channels with an analog signal output need to be sampled and interfaced with a readout device. Such a readout device may for example comprise an ADC and/or a peak detector.

Sample and hold systems 100 according to embodiments of the present invention may for example be used in the time domain. In such applications the sample and hold system may be used to acquire traces which can then be processed to detect objects. Such applications may be looking for pulses in the time domain trace. It is thereby an advantage of embodiments of the present invention that the output of the sample and hold system 100 does not comprise any bumps or offsets which are greater than the noise floor of the system. It is an advantage that these bumps or offsets can be reduced by sample and hold systems in accordance with embodiments of the present invention.

In a third aspect, embodiments of the present invention relate to an application system comprising a signal generation device for generating a signal and a sample and hold system according to embodiments of the present invention for acquiring the signal.

In embodiments of the present invention the dummy unit cells are sampled in a period when there is no input signal. This may for example be at the end of an application sampling window. The application sampling window may be defined such that the signal generation device does not generate an output signal outside the application sampling window. Such an application system may be a LIDAR.

In applications like LIDAR the array of optical structures is used as the sensor to detect reflected laser/led pulses. Normally these pulses are acquired multiple times and then averaged to improve SNR. In a system on chip implementation it is not practical to have an ADC for every channel. Therefore, in embodiments of the present invention, the sample and hold array 120 of unit cells 130 is inserted to capture the trace for every channel and then during readout phase connect these arrays to the ADC 150 by multiplexing. The array 120 of unit cells 130 can be both one dimensional or two dimensional. The two dimensional array of unit cells may for example exist of a plurality of one dimensional sample and hold arrays of unit cells, with for each channel a different one dimensional array of unit cells. These sample and hold arrays of unit cells are organised in segments wherein each segment comprises at least one dummy unit cell.

Any application wherein traces are acquired and averaged by a sample and hold system and which have benefit from a reduced noise level and of reduced offsets, have benefit from using a sample and hold system in accordance with embodiments of the present invention.

In a fourth aspect embodiments of the present invention relate to a method for capturing and reading a trace of an input signal 110. The method comprises an acquisition phase 310 wherein samples are taken from the input signal and held in the unit cells of different segments wherein each segment comprises a plurality of unit cells and a dummy unit cell, a readout phase 320 wherein the samples in the unit cells are read out segment by segment by a readout device, and wherein the dummy unit cell of a segment is read out directly after connecting the readout device to that segment.

Figure 12:
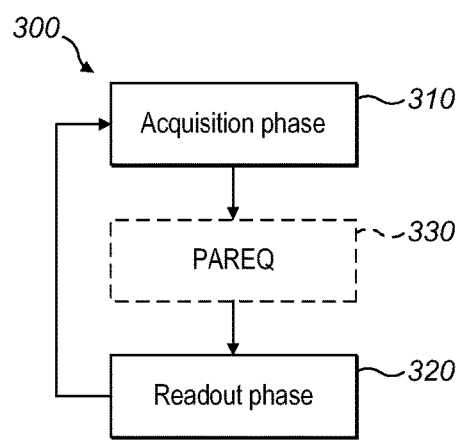
FIG. 12 shows a flow chart of a method in accordance with embodiments of the present invention.

In embodiments of the present invention the readout value of the dummy unit cells is ignored during further processing. In embodiments of the present invention the method may moreover comprise a parasitic equalisation phase 330 in between the acquisition phase 310 and the readout phase 320, wherein the segment switches 160b and possibly also the segment read switches 160c are closed. These segment switches are configured for connecting the segments with the readout device. An example of such a method is illustrated in FIG. 12.

The invention claimed is:

1. A sample and hold system, for capturing and reading a trace of at least one input signal,
   the sample and hold system comprising a readout device, a controller, an array of segments, each segment comprising a plurality of unit cells and a dummy unit cell, and access switches for controlling the access to the unit cells and the dummy unit cells, wherein at least part or all of the access switches are segment switches which are present between the segments and the readout device,
   wherein the controller is adapted for controlling the sample and hold system,
   such that during an acquisition phase a trace of samples is taken from the input signal and held in the unit cells and such that during a readout phase the samples held in the unit cells or in the dummy unit cells are read out by the readout device,
   wherein the controller is adapted for controlling the sample and hold system,
   such that the dummy unit cells are sampled in a period when there is no input signal,
   and such that after configuring the segment switches to connect a segment to the reading device, the dummy unit cell, is the first cell which is read out by the readout device resulting in a readout value wherein the sample and hold system is adapted for ignoring the readout value of the dummy unit cells during further processing.

2. A sample and hold system according to claim 1, wherein the controller is adapted for controlling the access switches using control signals derived from a sample clock for sampling the input signal.

3. A sample and hold system according to claim 2, wherein the control signals are a delayed version of the sample clock.

4. A sample and hold system according to claims 2, wherein each segment comprises a digital feedback loop configured to indicate, during the acquisition phase, to the unit cell which is accessed first in the segment that the last unit cell of that segment, before switching to another segment, is accessed.

5. A sample and hold system according to claim 1 wherein each unit cell and dummy unit cell is comprising a capacitor and wherein the capacitors are configured for holding the samples taken from the input signal and wherein for each of the segments the first terminals of the capacitors are connected with one side of one of the segment switches which is connected with the other side to the readout device.

6. A sample and hold system according to claim 5, wherein the controller moreover is configured for controlling the sample and hold system such that during a parasitic equalization phase, in between the acquisition phase and the readout phase at least part of the segment switches are closed.

7. A sample and hold system according to claim 1 wherein the readout device comprises an analog to digital convertor configured for digitizing, during the readout phase, the samples in the unit cells into digitized sample values.

8. A sample and hold system according to claim 1, wherein the unit cells and dummy unit cells are organized in rows and columns wherein each segment corresponds with a row comprising unit cells and a dummy unit cell.

9. A sample and hold system according to claim 1 wherein the readout device comprises an operational amplifier and wherein the unit cells and the dummy unit cell are connected with an input terminal of the operational amplifier.

10. A sample and hold system according to claim 9, the sample and hold system comprising for each segment a segment read switch in between the second terminals of the unit cells and of the dummy unit cell and an output of the operational amplifier.

11. An application system comprising a signal generation device and a sample and hold system according to claim 1 wherein the signal generation device is adapted for generating at least one output signal and wherein the at least one output signal is the at least one input signal of the sample and hold system.

12. An optical detector, the optical detector comprising a sample and hold system according to claim 1 and an array of optical sensors, each optical sensor comprising an input for detecting an optical signal and an output for generating an output signal which is representative for the detected optical signal, wherein the outputs of the optical sensors are the input signals of the sample and hold system.

13. A method for capturing and reading a trace of an input signal using a sample and hold system which comprises an array of segments, each segment comprising a plurality of unit cells and a dummy unit cell, and access switches for controlling the access to the unit cells and the dummy unit cells, wherein at least part or all of the access switches are segment switches which are present between the segments and the readout device, the method comprising:

an acquisition phase wherein samples are taken from the input signal and held in unit cells of different segments, wherein the dummy unit cells are sampled when there is no input signal, and wherein during a readout phase the samples in the unit cells are read out segment by segment by a readout device by configuring the segment switches to connect a segment to the reading device, wherein after configuring the segment switches to connect a segment to the reading device, the dummy unit cell, is the first cell which is read out by the readout device resulting in a readout value, and that the readout value of the dummy unit cells is ignored during further processing.

14. A method according to claim 13, the method furthermore comprising a parasitic equalization phase in between the acquisition phase and the readout phase, wherein during the parasitic equalization phase segment switches, which are configured for connecting the segments with the readout device, are closed.

* * * * *